(12) United States Patent
Tobinaga et al.

(10) Patent No.: US 12,028,977 B2
(45) Date of Patent: Jul. 2, 2024

(54) ELECTRONIC DEVICE

(71) Applicant: Panasonic Intellectual Property Management Co., Ltd., Osaka (JP)

(72) Inventors: Masato Tobinaga, Hyogo (JP);
Takahiro Mukai, Osaka (JP);
Shigehito Morita, Hyogo (JP); Masaru Furujiku, Osaka (JP); Ryusuke Teramoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 258 days.

(21) Appl. No.: 17/562,281

(22) Filed: Dec. 27, 2021

(65) Prior Publication Data

US 2022/0124909 A1      Apr. 21, 2022

Related U.S. Application Data

(63) Continuation of application No. PCT/JP2020/024529, filed on Jun. 23, 2020.

(30) Foreign Application Priority Data

Jul. 4, 2019   (JP) .................. 2019-125049

(51) Int. Cl.
*H05K 1/18*      (2006.01)
*G06F 1/16*      (2006.01)
(Continued)

(52) U.S. Cl.
CPC ........... *H05K 1/141* (2013.01); *G06F 1/1658* (2013.01); *H05K 1/147* (2013.01); *H05K 5/04* (2013.01); *G06F 1/1616* (2013.01)

(58) Field of Classification Search
CPC .......... H05K 1/141; H05K 1/147; H05K 5/04; G06F 1/1658; G06F 1/1616
(Continued)

(56) References Cited

U.S. PATENT DOCUMENTS 6,922,344 B2     7/2005   Meyer-Guldner
8,187,013 B2 *   5/2012   Saito ...................... H05K 1/118
                                                                    439/218

(Continued)

FOREIGN PATENT DOCUMENTS

CN        1450633 A      10/2003
CN        205005138 U     1/2016
(Continued)

OTHER PUBLICATIONS

English Translation of Chinese Office Action dated Sep. 15, 2023 for the related Chinese Patent Application No. 202080047001.5.
(Continued)

*Primary Examiner* — Binh B Tran
(74) *Attorney, Agent, or Firm* — Renner, Otto, Boisselle & Sklar, LLP (57) ABSTRACT

An electronic device is an electronic device on which an option replaceable by a user is mounted. The electronic device includes a main board and a flexible printed circuit board connected to the main board. The flexible printed circuit board has a coupling connector connected to an option board on which the option is mounted.

3 Claims, 7 Drawing Sheets

(51) Int. Cl.
    *H05K 1/14*    (2006.01)
    *H05K 5/04*    (2006.01)

(58) Field of Classification Search
    USPC .................................. 361/752, 784, 785, 789
    See application file for complete search history.

(56) References Cited

U.S. PATENT DOCUMENTS

| 9,814,148 B1 * | 11/2017 | Huang .................. H05K 1/147 |
| 2003/0173663 A1 | 9/2003 | Kami |
| 2015/0373238 A1 | 12/2015 | Tago |
| 2018/0027154 A1 | 1/2018 | Tago |
| 2018/0035070 A1 | 2/2018 | Liang |
| 2018/0124920 A1 | 5/2018 | Yoshida |
| 2019/0027800 A1 | 1/2019 | El Bouayadi |
| 2022/0167521 A1 * | 5/2022 | Mourieras ............ H05K 7/1407 |

FOREIGN PATENT DOCUMENTS

| JP | H05-080883 A | 4/1993 |
| JP | H05-082957 A | 4/1993 |
| JP | 2003-273278 A | 9/2003 |
| JP | 2015-038915 A | 2/2015 |
| JP | 2015-118953 A | 6/2015 |
| JP | 2019-071200 A | 5/2019 |
| WO | 2014/136925 A | 9/2014 |
| WO | 2016/152124 A1 | 9/2016 |

OTHER PUBLICATIONS

International Search Report for related Application No. PCT/JP2020/024529, mailed Sep. 24, 2020.

* cited by examiner

ELECTRONIC DEVICE

BACKGROUND

1. Technical Field

The present invention relates to an electronic device having an option replaceable by a user himself or herself.

2. Description of the Related Art

Patent Literature (PTL) 1 describes a shape of a flexible printed circuit board for a replaceable part in an electronic information device.

PTL1: Unexamined Japanese Patent Publication No. 85-82957

SUMMARY

The present disclosure shows a structure in which, in an electronic device having an option replaceable by a user himself or herself, impact at the time of attaching the option can be reduced while securing signal quality of a high-speed signal flowing between the electronic device and the option.

An electronic device in the present disclosure is an electronic device on which an option replaceable by a user is mounted. The electronic device includes a main board and a flexible printed circuit board connected to the main board. The flexible printed circuit board has a coupling connector connected to an option board on which the option is mounted.

The electronic device in the present disclosure makes it possible to secure low cost by a connector with a small number of pins and secure assemblability while securing signal quality of a high-speed signal and suppressing impact at the time of attachment of the option to an electronic device main body, thereby achieving an option function that can be replaced by a user.

DETAILED DESCRIPTION

Hereinafter, exemplary embodiments will be described in detail with reference to the drawings as needed. It is noted that unnecessarily detailed description may be omitted. For example, detailed description of already well-known matters and redundant description of a configuration substantially identical to the already-described configuration may be omitted. This is to prevent the following description from being unnecessarily redundant and thus to help those skilled in the art to easily understand the present disclosure.

Note that the inventors of the present disclosure provide the accompanying drawings and the following description in order to allow those skilled in the art to fully understand the present disclosure, and do not intend to limit the subject matter as described in the claims.

First Exemplary Embodiment

Hereinafter, a first exemplary embodiment will be described with reference to the drawings.

1-1. Configuration, Etc

Figure 1:
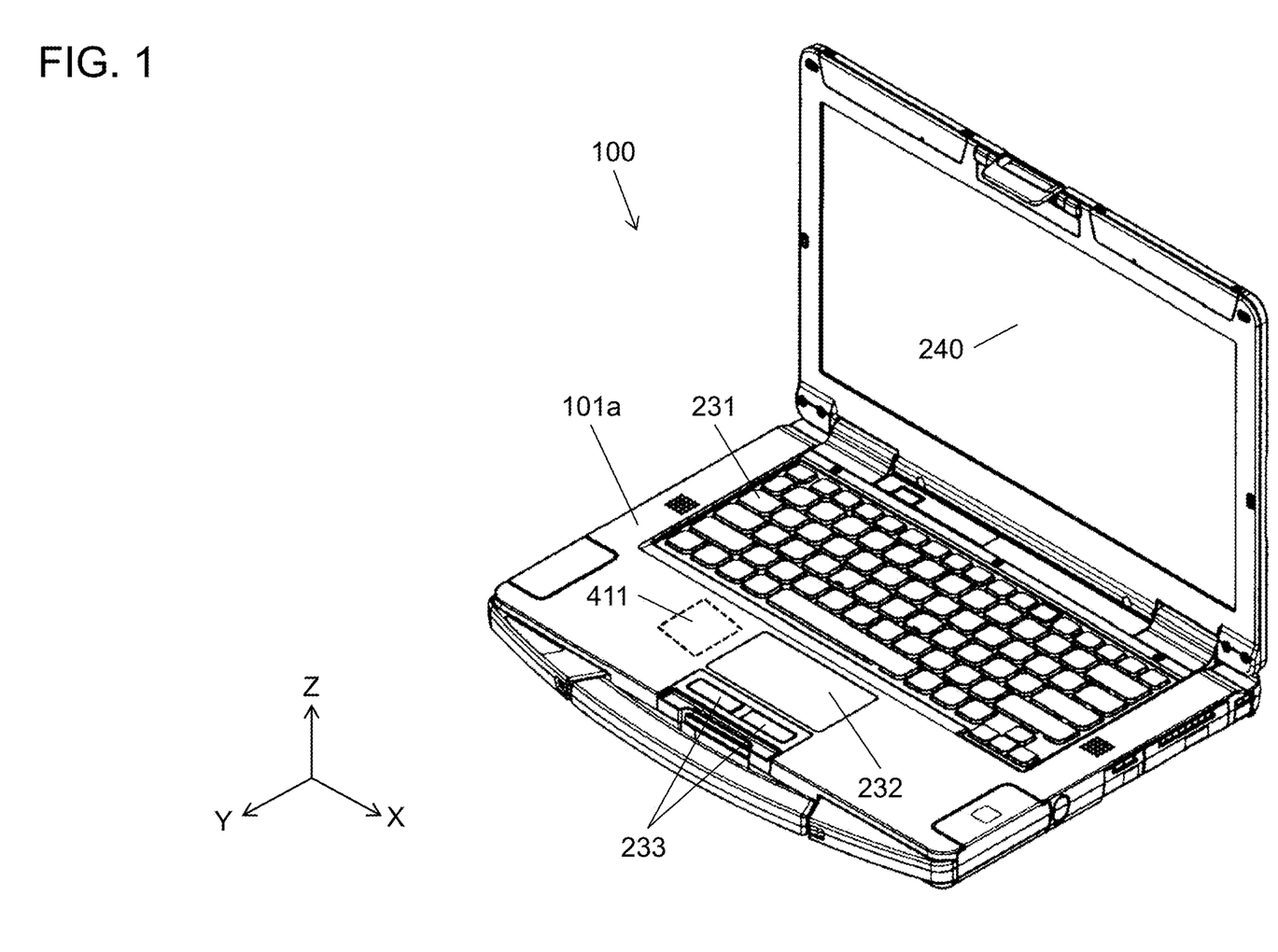
FIG. 1 is a perspective view of a computer according to a first exemplary embodiment.
Figure 2:
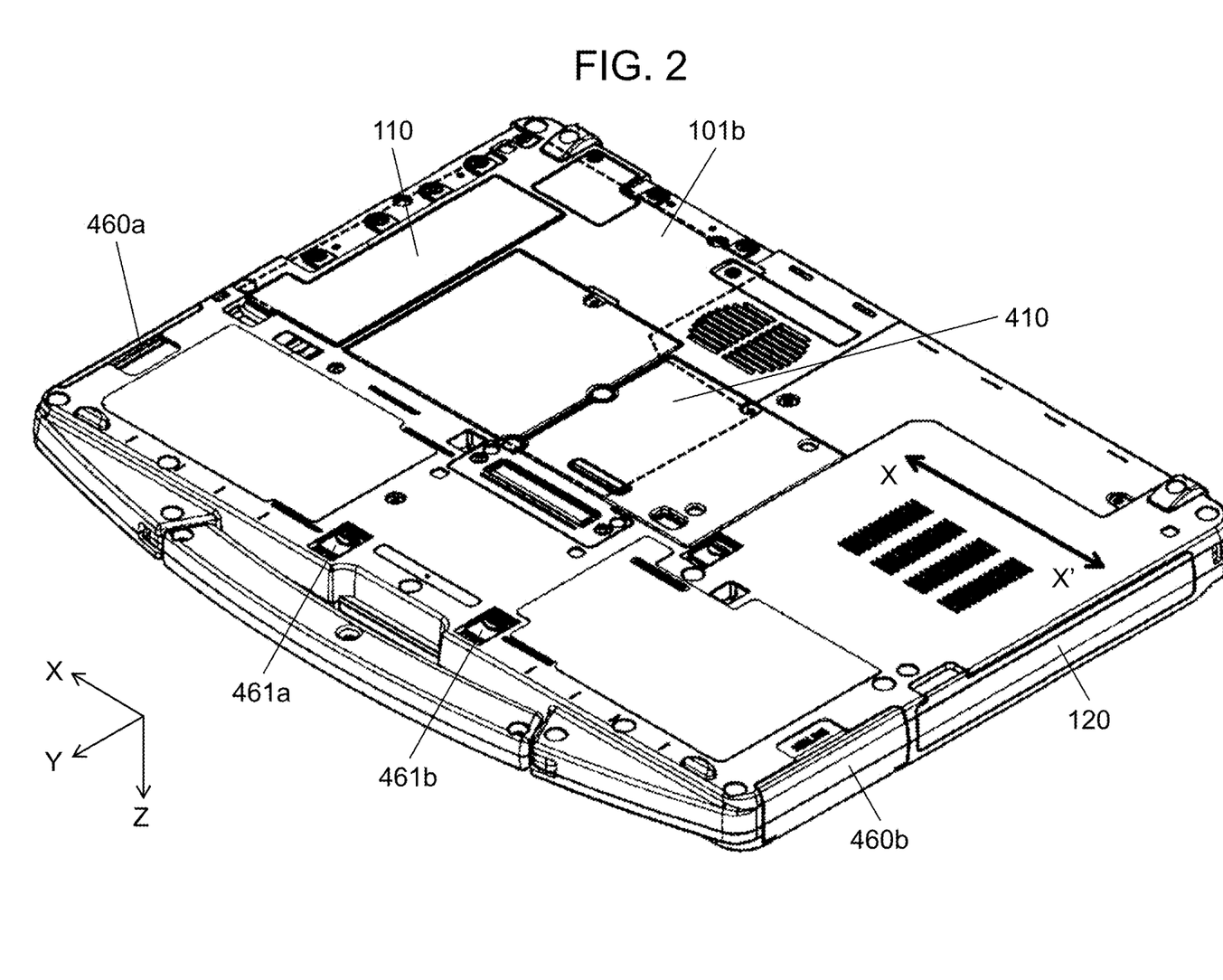
FIG. 2 is a bottom view of a second housing of the computer according to the first exemplary embodiment.

FIG. 1 is a perspective view of a computer according to the first exemplary embodiment, and FIG. 2 is a bottom view of a second housing of the computer. Computer 100 is an example of an electronic device in the present disclosure, and includes first housing 101a and second housing 101b. Computer 100 is a notebook computer.

In order to simplify the description, it is assumed that a width direction of computer 100 is an X-axis direction, a front-back direction of computer 100 is a Y-axis direction, and a height direction of computer 100 is a Z-axis direction.

First housing 101a is provided with display 240, keyboard 231, touch pad 232, operation button 233, central processing unit (CPU) 411, and the like.

Display 240 displays an image and a picture on the basis of an image signal input. Display 240 is configured by a liquid crystal display, for example.

Keyboard 231 includes a plurality of keys and outputs a signal corresponding to a key pressed by a user.

Touch pad 232 is a pointing device that outputs a signal corresponding to a position touched by the user.

Operation button 233 is a press-type button switch, and outputs a signal indicating pressing of the button when the button is pressed by the user. Operation button 233 is used as, for example, a determination button.

CPU 411 controls the entire operation of computer 100. CPU 411 performs arithmetic processing on the basis of an operating system (OS) and various application programs stored in a storage, data stored in the storage, and information input from various input devices, and achieves various functions to be described later.

Second housing 101b is disposed on a bottom surface of computer 100.

As illustrated in FIG. 2, removable solid state drive (SSD) 110 and option unit 120 can be attached to a lower surface of second housing 101b.

Removable SSD 110 is detachable by a user, and can be removed by a detachable lever (not illustrated).

By sliding option unit 120 in an X-X' direction in FIG. 2, the user by himself or herself can attach and detach the option unit to and from computer 100.

As illustrated in FIG. 2, battery units 460a and 460b attachable and detachable to and from second housing 101b are attached to both ends in the width direction (X-axis direction) of the lower surface of second housing 101b.

Even when one of battery units 460a and 460b is removed, the operation of computer 100 (electronic device) can be continued as long as the other battery unit has a remaining capacity. Further, one of battery units 460a and 460b can be exchanged while the operation of computer 100 is continued. Battery units 460a and 460b can be attached and detached to and from second housing 101b by operating operation levers 461a and 461b.

Figure 3:
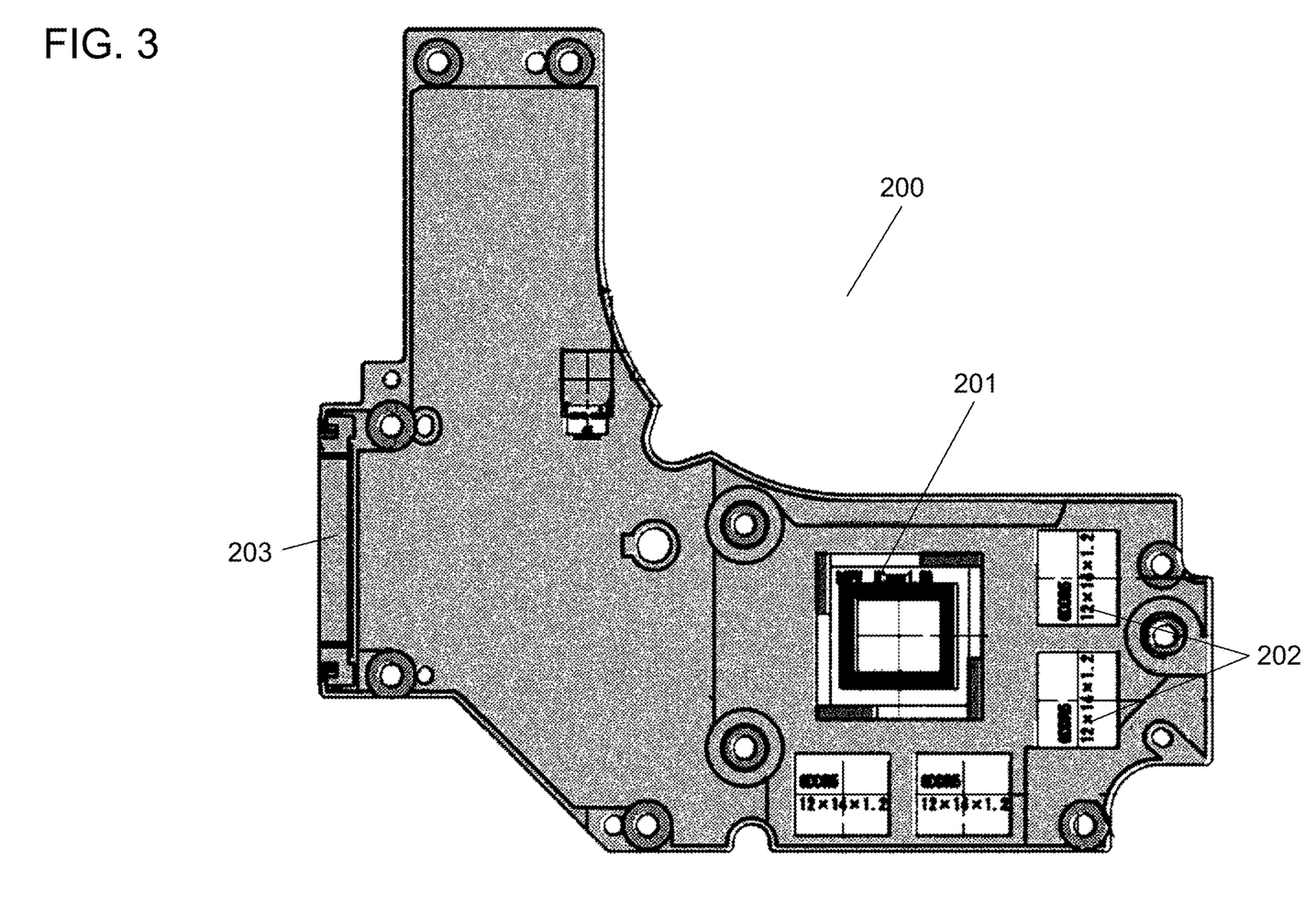
FIG. 3 is an external view of a printed circuit board for option equipped with a graphics processing unit (GPU) according to the first exemplary embodiment.

FIG. 3 is an external view of a printed circuit board for option (GPU option) equipped with a GPU that is an option replaceable by a user (user-replaceable option).

GPU 201, GPU memory 202, and option-side coupling connector 203 are mounted on printed circuit board for option 200.

Printed circuit board for option 200 is configured with a base material layer made of a resin such as glass epoxy and a conductor layer made of a metal foil represented by copper. In the present exemplary embodiment, a board having eight layers or ten layers is used.

GPU 201 is a large scale integration (LSI) specialized for video processing, and is used, for example, in creating computer graphics (CG) or in computer-aided design (CAD) operation.

Since option-side coupling connector 203 has a concave-convex relationship with main-side coupling connector 211 (FIG. 4) of flexible printed circuit board 210 to be described later, the connectors can be connected with each other.

By connecting such a GPU option to computer 100, video processing performance of the electronic device can be improved, and high-resolution video editing and the like can be achieved outdoors.

Figure 4:
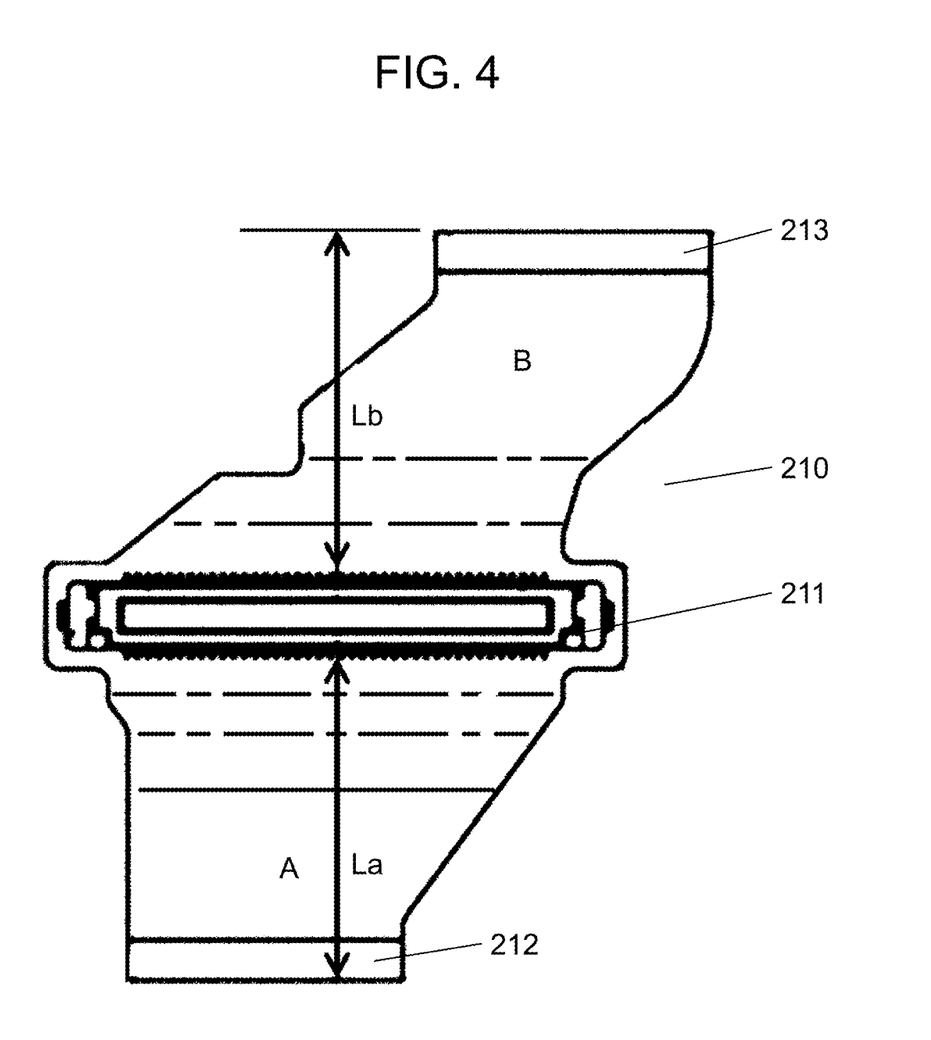
FIG. 4 is a perspective view of a flexible printed circuit board to which the printed circuit board for option is attached according to the first exemplary embodiment.

Next, a structure of a flexible printed circuit board on which a user-replaceable option such as a GPU option is mounted will be described. FIG. 4 is a perspective view of a flexible printed circuit board to which a user-replaceable option is attached.

Flexible printed circuit board 210 illustrated in FIG. 4 includes main-side coupling connector 211, high-speed signal transmission connector contact 212, and power supply transmission connector contact 213.

Flexible printed circuit board 210 includes a base film layer made of a resin such as liquid crystal polymer (LCP), a ground layer formed in a solid coating shape on one surface of the base film by a metal foil, and a wiring pattern layer made of metal on the other surface of the base film. An insulating cover layer made of a non-conductive sheet or the like is formed on each of the ground layer and the wiring pattern layer.

Note that the flexible printed circuit board in the present disclosure is not limited to this configuration. Each material constituting each layer of flexible printed circuit board 210 has bendable flexibility. Therefore, flexible printed circuit board 210 has flexibility that allows flexible bending.

Main-side coupling connector 211 is mounted on a central portion of flexible printed circuit board 210 by soldering. That is, flexible printed circuit board 210 has regions A and B extending from main-side coupling connector 211 and having different lengths in a direction (an up-down direction shown in FIG. 4) facing to each other. A wiring pattern for a high-speed signal is disposed in the region A (a first region) having a short wiring length, and a wiring pattern for a low-speed signal and a power supply is disposed in the region B (a second region) having a long wiring length. That is, a length La of the region A is shorter than a length Lb of the region B. In addition, high-speed signal transmission connector contact 212 (an example of a first region connector) is disposed at an end portion of the region A, and power supply transmission connector contact 213 (an example of a second region connector) is disposed at an end portion of the region B.

With such a structure, it is possible to reduce a transmission loss in a region where a high-speed signal is transmitted and to secure signal quality of the high-speed signal. Note that the high-speed signal is transmitted by a differential signal of PCI Express, USB 3.1, HDMI (registered trademark), DisplayPort or the like.

Figure 5:
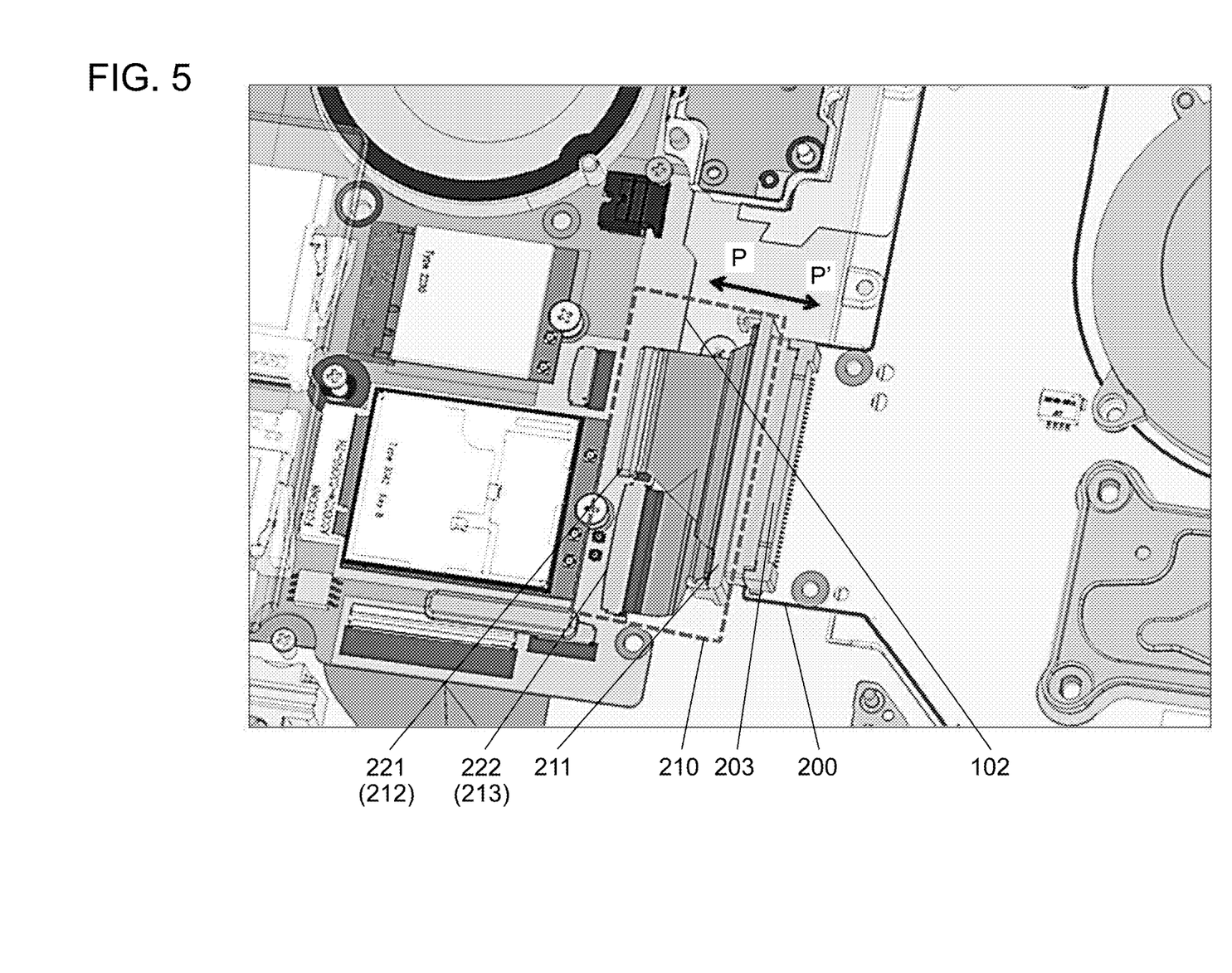
FIG. 5 is a view illustrating a connection state of the printed circuit board for option, the flexible printed circuit board, and a main board according to the first exemplary embodiment.

Next, a connection state between the user-replaceable option and main board 102 of computer 100 will be described. FIG. 5 is a view illustrating a connection state of the GPU option, the flexible printed circuit board, and the main board according to the first exemplary embodiment.

Option-side coupling connector 203 of printed circuit board for option 200 is connected to main-side coupling connector 211 of flexible printed circuit board 210 because the connectors have a concave-convex relationship. In addition, since main-side coupling connector 211 is mounted on flexible printed circuit board 210 and is movable in a P-P' direction illustrated in FIG. 5, it is possible to absorb impact when the user-replaceable option is connected to the main body, and it is possible to prevent option-side coupling connector 203 and main-side coupling connector 211 from being broken by the impact.

Flexible printed circuit board 210 is bent in a direction in which ground surfaces where ground layers of the region A and the region B are formed face to each other with main-side coupling connector 211 as an apex, and is connected to main board 102 by high-speed signal transmission connector contact 212 and power supply transmission connector contact 213. On main board 102, high-speed signal transmission connector 221 and power supply transmission connector 222 are mounted on the same component mounting surface, high-speed signal transmission connector contact 212 being connected to high-speed signal transmission connector 221, and power supply transmission connector contact 213 being connected to power supply transmission connector 222.

Therefore, in a state where flexible printed circuit board 210 is connected to main board 102, high-speed signal transmission connector contact 212 and power supply transmission connector contact 213 are also located on the same surface of main board 102. This enables easy repairment of these components when they develop a failure.

In addition, the region A and the region B of flexible printed circuit board 210 are connected to main board 102 so as to have S-shaped (wave-shaped) bending. In this case, since a length from main-side coupling connector 211 to high-speed signal transmission connector contact 212 in the region A is shorter than a length from main-side coupling connector 211 to power supply transmission connector contact 213 in the region B, a bending amount of the region A is smaller than that of the region B.

Figure 6:
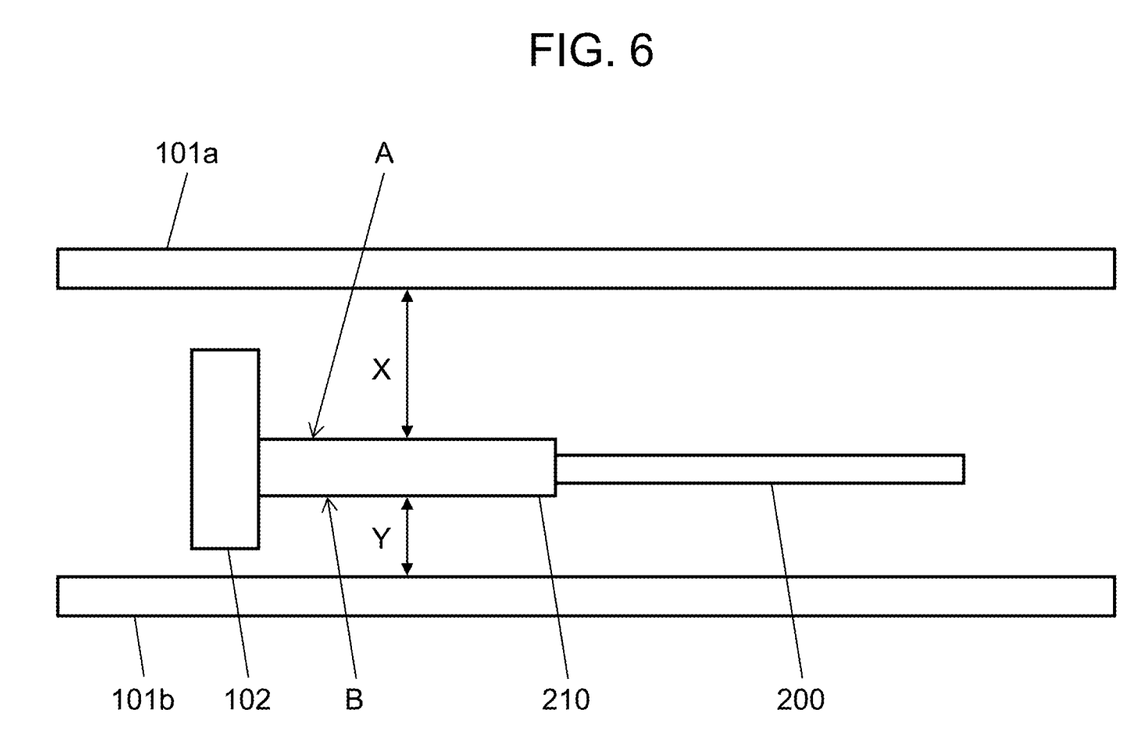
FIG. 6 is a view illustrating a positional relationship between the flexible printed circuit board and a metal housing according to the first exemplary embodiment.

Next, description will be made of a positional relationship with the metal housing when flexible printed circuit board 210 is incorporated in computer 100. FIG. 6 is a view showing a positional relationship between flexible printed circuit board 210 attached to computer 100 according to the first exemplary embodiment and metallic first housing 101a (a first metal housing) and metallic second housing 101b (a second metal housing).

As illustrated in FIG. 6, the region A having a short wiring length and the region B having a long wiring length of flexible printed circuit board 210 have their ground surfaces facing to each other, and a distance X (interval) between the region A having a short wiring length and the housing has a relationship of X>Y in which Y represents a distance (interval) between the region B having a long wiring length and the housing. As a result, it is possible to prevent an impedance in the region A having a short wiring length in which the high-speed signal is transmitted from varying depending on the metal housing and prevent a return current of the high-speed signal from flowing to the metal housing, thereby securing signal quality of the high-speed signal and achieving noise reduction.

1-2. Advantageous Effects, Etc

The electronic device according to the present disclosure includes: a main board on which two types of flexible printed circuit (FPC) connectors, i.e., a high-speed signal transmission connector and a power supply transmission connector, are disposed on the same surface; and a flexible printed circuit board attached to the FPC connector. The flexible printed circuit board has regions having different wiring lengths in directions opposed to each other from the main-side coupling connector. The high-speed signal is arranged in a region where the wiring length is short and the folding amount is small. Since the main-side coupling connector is movable in the P-P' direction illustrated in FIG. 5 in the housing, it is possible to prevent impact at the time of option insertion.

According to the present invention, in an electronic device having an option attachable and detachable by a user himself or herself, it is possible to secure low cost by a connector with a small number of pins and secure easy assemblability while securing signal quality of a high-speed signal between the electronic device and the option and suppressing impact at the time of attachment of the option, thereby improving convenience for the user.

Second Exemplary Embodiment

Figure 7:
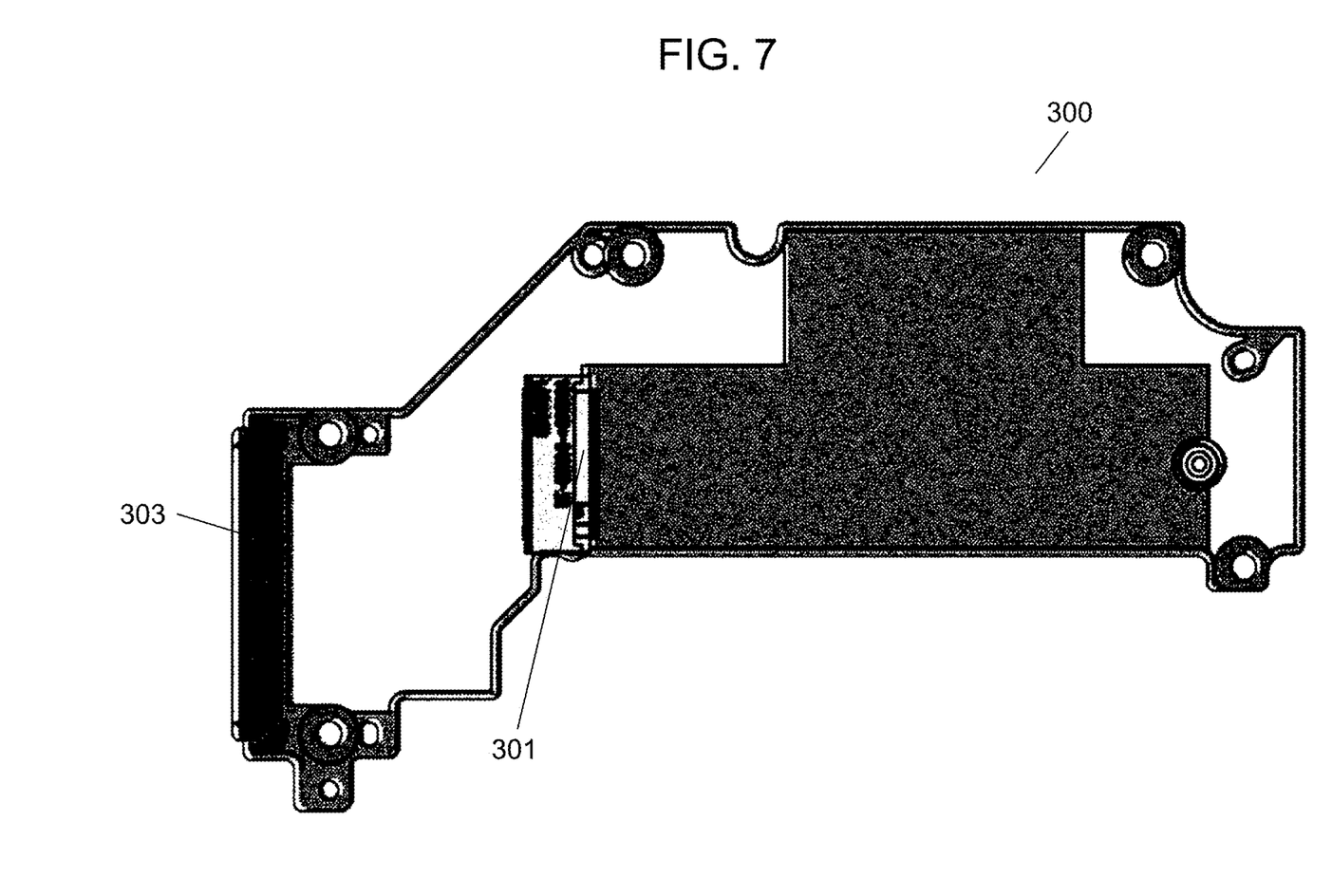
FIG. 7 is an external view of a printed circuit board for option on which a recording medium can be mounted according to a second exemplary embodiment.

FIG. 7 is an external view of a printed circuit board for option on which a spare recording medium can be mounted among printed circuit boards for option replaceable by a user.

Recording medium inserting connector 301 and option-side coupling connector 303 are mounted on printed circuit board for option 300. Option-side coupling connector 303 is functionally the same as option-side coupling connector 203 of printed circuit board for option 200 equipped with the GPU described in the first exemplary embodiment. In other words, option-side coupling connector 303 is connected to main-side coupling connector 211 mounted on flexible printed circuit board 210 as a result of insertion. This enables a recording medium mounted on printed circuit board for option 300 to be used as a recording medium of computer 100 (the electronic device) via flexible printed circuit board 210 mounted on the main board.

In the present exemplary embodiment, an SSD is described as an example of a recording medium mounted on printed circuit board for option 300, the SSD being the same as that equipped in the main body of computer 100. Mounting the recording medium in addition to the main body as described above enables storage regions to be disposed at two places, on the electronic device main body side and the option unit, thereby obtaining a configuration of redundant arrays of inexpensive disks (RAID). Therefore, it is possible to prevent damage of basic data of a system such as an OS and improve reliability of the electronic device.

The storage medium mounted on the printed circuit board for option is not limited to an SSD, and various memory cards and hard disk drives can be also applied to the present configuration.

According to the present invention, in an electronic device having an option attachable and detachable by a user himself or herself, it is possible to secure low cost by a connector with a small number of pins and secure easy assemblability while securing signal quality of a high-speed signal between the electronic device and the option and suppressing impact at the time of attachment of the option to the electronic device main body, thereby improving convenience for the user.

Other Exemplary Embodiments

As described in the foregoing, the first and second exemplary embodiments have been described as examples of the technique disclosed in the present application. However, the technique of the present disclosure is not limited to these exemplary embodiments, and is also applicable to any exemplary embodiment in which change, replacement, addition, or omission is appropriately made. In addition, a new exemplary embodiment can be made by combining the components described in the above exemplary embodiments. Therefore, another exemplary embodiment will be described below as an example.

In the above first and second exemplary embodiments, the description has been made of the case where the electronic device according to the present disclosure is applied to a notebook computer. However, the present disclosure is applicable to various electronic devices such as a smartphone, a tablet computer, a portable game apparatus, and a digital camera other than the notebook computer.

The present disclosure can be widely used in an electronic device on which a user-replaceable option can be mounted.

What is claimed is:

1. An electronic device on which an option replaceable by a user is mounted, the electronic device comprising:
   a main board; and
   a flexible printed circuit board connected to the main board, the flexible printed circuit board having a coupling connector connected to an option board on which the option is mounted,
   wherein the flexible printed circuit board includes a first region where a high-speed signal is arranged and a second region where a low-speed signal and a power supply are arranged, and
   a ground surface of the first region and a ground surface of the second region face to each other, and a first region connector connected to the first region and a second region connector connected to the second region are connected to a same surface of the main board.

2. The electronic device according to claim 1, wherein the first region of the flexible printed circuit board has S-shaped bending.

3. The electronic device according to claim 1, further comprising:
   a first metal housing; and
   a second metal housing,
   wherein an interval between the first region and the first metal housing is larger than an interval between the second region and the second metal housing.

* * * * *